United States Patent [19]

Underhill et al.

[11] Patent Number: 4,602,219
[45] Date of Patent: Jul. 22, 1986

[54] JITTER REDUCTION CIRCUIT FOR FREQUENCY SYNTHESIZER

[75] Inventors: Michael J. Underhill, Horsham; Richard I. H. Scott, Whitchurch, both of England

[73] Assignee: U.S. Philips Corporation, New York, N.Y.

[21] Appl. No.: 783,317

[22] Filed: Oct. 2, 1985

Related U.S. Application Data

[63] Continuation of Ser. No. 733,397, May 10, 1985, abandoned, which is a continuation of Ser. No. 465,385, Feb. 10, 1983, abandoned.

[30] Foreign Application Priority Data

Mar. 19, 1982 [GB] United Kingdom ............... 8208094

[51] Int. Cl.⁴ .................... H03B 19/00; H03L 7/18
[52] U.S. Cl. .................................... 331/16; 331/18; 331/25; 328/14; 328/25
[58] Field of Search ............ 331/1 A, 16, 17, 18, 331/25; 328/14, 25, 30; 377/48

[56] References Cited

U.S. PATENT DOCUMENTS 4,179,670 12/1979 Kingsbury ..................... 331/16 X
4,380,743 4/1983 Underhill et al. ................ 331/1 A
4,468,632 8/1984 Crowley ......................... 331/25 X

FOREIGN PATENT DOCUMENTS 1447418 8/1976 United Kingdom .

Primary Examiner—Siegfried H. Grimm
Attorney, Agent, or Firm—Joseph P. Abate

[57] ABSTRACT

A frequency synthesizer of the pulse cancellation type which predicts the phase jitter that will be caused by the pulse cancellation and generates a compensation signal C which precisely compensates for the phase jitter. The compensation signal is derived directly, from a pulse train in the synthesizer which itself contains jitter, via a d.c. removal circuit DCR and an analogue integrator INT.

19 Claims, 2 Drawing Figures

JITTER REDUCTION CIRCUIT FOR FREQUENCY SYNTHESIZER

This is a continuation of application Ser. No. 733,397, filed May 10, 1985, which was a continuation of application Ser. No. 465,385, filed Feb. 10, 1983 both of which are now abandoned.

BACKGROUND OF THE INVENTION

This invention relates to a frequency synthesizer comprising a reference frequency generator, a frequency control circuit comprising frequency reduction means which includes a cycle cancellation circuit which is arranged to cancel a cycle of the frequency to be reduced by the reduction means for each input pulse to said cancellation circuit from a pulse source, and a compensation signal circuit connected to the frequency control circuit, the output signal of the compensation signal circuit being arranged to compensate, at least partly, for any jitter in the period of the output frequency that would otherwise be caused by each cancelled cycle.

Such frequency synthesizers are known and are either of the "direct" type in which the output frequency is derived directly from the reference frequency or of the "indirect", or phase lock loop, type in which the output frequency is generated by a variable frequency oscillator forming part of a phase lock loop which locks the oscillator to a predetermined rational fraction, which is to be understood as including a multiple, of the reference frequency.

Examples of direct frequency synthesizers are described in U.K. Patent Specification Nos.: 1,545,953 and 2,062,315, and examples of phase lock loop synthesizers are described in U.K. Patent Specification Nos.: 1,447,418 and 2,068,185. In each type, it is known to use a variable modulus divider to provide the major part of the required frequency reduction, but such dividers can only produce spectrally pure frequencies which are exact subharmonics of the frequency which is to be divided. The frequencies other than subharmonics are produced by a cycle cancellation technique in which predetermined cycles of the frequency to be reduced are cancelled. Such a technique is well known and is alternatively referred to as sidestep programming (see, for example, A. F. Evers and D. J. Martin, "Improved forms of digital frequency synthesisers", *IEE Colloquium Digest* 1972/11, pp. 9/1 to 9/5), pulse blanking, pulse removal, pulse cancellation, and pulse or cycle swallowing. The technique is also described in *Mullard Technical Note* 142 "Versatile LSI frequency synthesiser" pp. 8, 9.

In the prior art devices, the pulse source derives the cycle-cancelling pulses from the reference frequency or from the variable frequency oscillator, typically by means of at least a programmable rate multiplier which produces a programmable number of output pulses for a fixed number of input pulses. These output pulses have an average frequency which can be any rational fraction of the frequency from which they are derived. Since they are strobed by the input pulses, however, the periods between successive output pulses may vary and these variations (referred to as "jitter") would produce variations in the output frequency unless a compensation signal circuit is provided to reduce the effects of the jitter.

In the frequency synthesizer described in the above-mentioned Patent Specification No. 1,447,418, the frequency reduction is partly effected by a successive addition rate multiplier which, for each input pulse thereto, adds a programmable increment to an accumulated value and gives an output pulse each time the capacity of the accumulator is exceeded, leaving the excess as a residue in the accumulator. The principle of its operation can readily be appreciated by taking a simple example in which the capacity of the accumulator is unity and each input pulse adds 0.7 to the value in the accumulator. Thus, the accumulator overflows and gives an output pulse for the 2nd, 3rd, 5th, 6th, 8th, 9th, and 10th input pulses—i.e. seven output pulses for ten input pulses. In other words, the average pulse repetition rate has been multiplied by 0.7 by the rate multiplier.

Said patent specification No. '418 describes a system in which the residue in the accumulator is converted to analogue form in a digital-to-analogue converter and the resultant analogue signal is used to compensate for any variation in the output of the phase comparator due to jitter. It was appreciated that the residue in the accumulator at any instant is a function of the amount of phase jitter that the resulting cancelled pulse will cause. While being particularly effective, the electronic circuitry used is nevertheless relatively complex.

In at least the great majority of modern frequency synthesizers, a rate multiplier is used to determine the size of the minimum frequency step and the pulse input is derived either from the reference frequency generator or, in the case of phase lock loop type synthesizers, from a voltage controlled oscillator which provides the output frequency. The compensation signal, which effectively predicts any phase jitter, is derived from the circuitry of, or associated with, the rate multiplier, or at least depends upon the "history" of the pulses which cause the cycle cancellation, in order to provide a predictive compensation signal.

SUMMARY OF THE INVENTION

An object of the present invention is to provide a frequency synthesizer of the type defined in the opening paragraph hereof which enables the electronic hardware to be reduced, provides improved sideband suppression, and enables any pulse source to be used.

According to the invention there is provided a frequency synthesizer comprising a reference frequency generator, a frequency control circuit comprising frequency reduction means which includes a cycle cancellation circuit which is arranged to cancel a cycle of the frequency to be reduced by the reduction means for each input pulse to said cancellation circuit from a pulse source, and a compensation signal circuit connected to the frequency control circuit, the output signal of the compensation signal circuit being arranged to compensate, at least partly, for any jitter in the period of the output frequency of the synthesizer that would otherwise be caused as a result of each cancelled cycle, characterized in that the compensation signal circuit comprises a d.c. removal circuit followed by an analogue integrator and, in operation, derives the compensation signal directly from a pulse train which itself contains jitter which would otherwise cause said jitter in the period of the output frequency.

A frequency synthesizer according to the invention has the advantages that any pulse source may be used to provide a frequency offset and that the compensation signal, which in effect predicts the phase jitter, is derived by d.c. removal and analogue integration of any pulse train containing jitter caused by the source. In known frequency synthesizers of the so-called "phase predict" type in which a jitter compensation signal is generated, the compensation signal circuit uses digital techniques and generally includes a digital-to-analogue converter. In the practical implementation of these techniques, it is not possible to get the various analogue step sizes identical over the whole signal range required. As a result, spurious sideband noise is produced at a level of about 30 dB down with respect to the output signal level. Using direct analogue integration, however, no conversion errors are produced after gain balancing and the sideband noise level is reduced by a further 20 to 30 dB.

Thus, a synthesizer according to the invention not only provides a remarkable improvement in sideband rejection but also very considerably reduces the circuit complexity. It is in fact the case that the compensation signal circuit can be connected to substantially any point in the synthesizer circuit at which a pulse train appears which contains jitter which, in the absence of the compensation signal circuit, may for example be connected to the input or to the output of the cycle cancellation circuit. In the former case, the compensation signal is derived from the pulses which cause the cycle cancellation whereas in the latter case it is derived from a pulse train from which the cycles have been cancelled.

For present purposes, the d.c. removal circuit referred to above is to be understood as including not only d.c. blocking circuits but also circuits which compensate for or nullify any effect the d.c. may have. Thus, while the presence of d.c. in the signal applied to the integrator would cause the latter to saturate, the effect of the d.c. can be compensated for or nullified in a manner described, for example, in United Kingdom Patent Specification No. 2,074,421A.

The compensation signal circuit may include an amplifier the gain of which is inversely proportional to the output frequency of the synthesizer. This not only ensures that the level of the compensation signal is correct but also that any variation in the output signal due to large frequency changes in the output frequency of the synthesizer is precisely compensated.

The pulse source may derive pulses from the reference frequency generator, or from the output of the synthesizer, and may include a rate multiplier. Frequency dividers are necessary in such cases to reduce the frequency of the pulses to a value which is very low compared with the frequency sources from which it is derived. This complication is avoided if the pulse source comprises a pulse generator having a variable frequency. Thus, for example, if the lowest frequency step of the synthesizer without the pulse source is 100 Hz, then a pulse source having a variable frequency from 0 to 100 Hz enables the minimum step size to be reduced to 1 Hz or less.

If the synthesizer is of the known phase lock loop type including a variable frequency oscillator, a phase comparator which compares the phases of the output frequency and the reference frequency after said frequency division, and a loop filter, a phase modulator may be included in either input path to the phase comparator, the output of the compensation signal circuit being connected to the phase modulation control input of the phase modulator. As a result, any phase jitter that may appear at one input of the phase comparator due to pulse cancellation in the path between the variable frequency oscillator and the phase comparator is compensated for by an identical phase jitter, caused by the phase modulator, at the other input. Thus, the frequency control signal fed to the variable frequency oscillator from the phase comparator via the loop filter contains no jitter component. Alternatively, the compensation signal may be added to the output of the phase comparator such that it cancels out any phase jitter present in the output of the phase comparator.

If, on the other hand, the frequency synthesizer is of the direct type in which at least the major portion of the output frequency is generated directly from the reference frequency, the output of the compensation signal circuit may be used to control the delay of a delay generator whereby the output pulses of the delay generator, which constitute the output of the synthesizer, are respectively delayed by such an amount that the periods between them are constant.

BRIEF DESCRIPTION OF THE DRAWING

Embodiments of the invention will now be described, by way of example, with reference to the accompanying drawing, of which.

DESCRIPTION OF THE PREFERRED EMBODIMENTS

Figure 1:
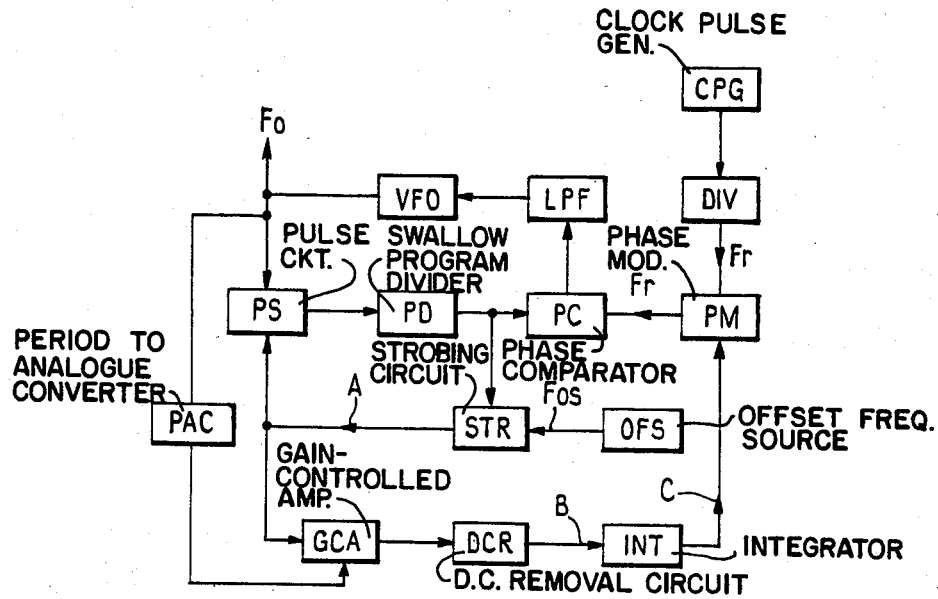
FIG. 1 is a block schematic circuit diagram of a frequency synthesizer of the phase lock loop type.
Figure 2:
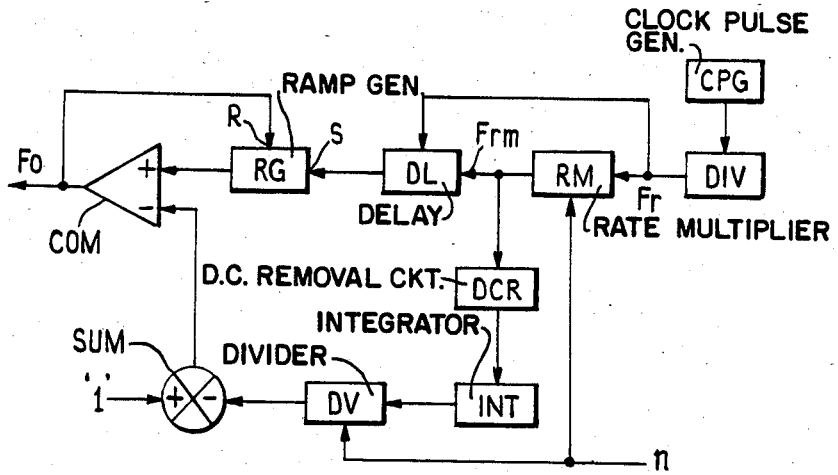
FIG. 2 is a block schematic circuit diagram of a frequency synthesizer of the direct type.

FIG. 1 shows a block schematic circuit diagram of a first embodiment of the invention comprising a voltage-controlled variable frequency oscillator VFO, the output of which constitutes the synthesizer output (frequency Fo) and is connected to one input of a pulse swallow circuit PS. The output of circuit PS is connected to a programmable divider PD which divides by an adjustable number N>1. The output of divider PD is connected to a first comparison input of a phase comparator PC and also to the strobe input of a strobing circuit STR. The other input of circuit STR is connected to the output of an offset frequency source OFS having a variable frequency Fos in a range which is low relative to the output frequency range of the synthesizer. For example, the synthesizer may have an output frequency range of 1.6 MHz to 30 MHz adjustable by divider PD in 1 kHz steps and the variable offset frequency source OFS may have a range of 0 to 990 Hz variable in 10 Hz steps. The source may, for example, derive the offset frequency from a clock pulse generator CPG or from the output of divider PD, the connections thereto not being shown in the Figure. Thus, for example, the source OFS may comprise a rate multiplier and a divider as shown at RM and D1, respectively, in FIG. 3 of U.K. Patent Specification No. 1,447,418 or may simply comprise a rate multiplier R as shown in FIG. 2 of that specification. The offset frequency source may alternatively generate an offset frequency directly in response to an analogue or a digital input. There are of course many ways in which such an offset frequency may be provided—all that is required is that the range of the output frequency Fos of the source is low compared with the frequency range of the synthesizer since the controllable range of frequency Fr establishes the smallest frequency step of the synthesizer.

The output of strobing circuit STR is connected to the "swallow" command input of pulse swallow circuit PS and also to the input of a d.c. removal circuit DCR via a gain-controlled amplifier GCA. The output of the circuit DCR is fed via an analogue integrator INT to the phase control input of a phase modulator PM. The clock pulse generator CPG provides pulses having a high stable repetition rate (frequency) and the frequency of these pulses is, if required, divided down in a divider DIV to provide a reference frequency Fr (e.g. 1000 p.p.s.) which is fed via the phase modulator PM to a second comparison input of phase comparator PC. The output signal from comparator PC is fed to the frequency control input of oscillator VFO via a low-pass loop filter LPF.

The operation of the phase lock loop control circuit VFO-PS-PD-PC-LPF-VFO is well known and is described in terms of these referenced items in the above-mentioned U.K. Patent Specification No. 1,447,418. Briefly, the output signal of comparator PC is integrated in a low-pass filter LPF and adjusts the frequency of the oscillator VFO until the phase of the signal fed to the first comparison input of comparator PC from divider PD is identical to the phase of the signal fed to the second comparison input of the comparator PC via phase modulator PM. If the relative phases of the two input signals to comparator PC tend to differ slightly, then the output signal of comparator PC changes accordingly in such a direction that the phase of oscillator VFO is shifted to reduce the phase difference between the two input signals to comparator PC to zero.

The remainder of the circuit differs from the prior art and its operation will therefore be described in more detail. Output pulses from the source OFS, having an average frequency Fos, are strobed in circuit STR by the output pulses of divider PD to produce output pulses of a defined length. These pulses operate circuit PS in precisely the same manner as the corresponding pulses Fr in FIG. 2 of said patent specification No. 1,447,418 and offset the output frequency Fo by Fos. Thus, Fos may be selected to give a very fine control of the output frequency Fo. These pulses form a pulse signal A which is applied to a d.c. removal circuit DCR which either removes any d.c. component in the pulse signal (e.g. by a series capacitor) or compensates for any saturation effect the d.c. may give rise to in the integrator. A particularly suitable compensation method is described in GB Patent Specification No. 2,072,241A. The resulting signal B is integrated by an analogue integrator INT to produce a signal C which is used to control the phase delay generated by phase modulator PM.

As described above, the operation of the circuit PS in response to the pulse signal A causes jitter in the pulses appearing at the output of divider PD, this jitter appearing as a phase delay in the pulses each time circuit PS is caused to swallow a pulse by the arrival of a pulse in signal A. This same pulse is used, via the circuit elements DCR and INT, to cause a corresponding phase delay in the pulse from phase modulator PM. Thus, the pulse from modulator PM to comparator PC is delayed to substantially the same extend as the jitter delay in the corresponding pulse from divider PD. Thus, the effects of jitter on the output frequency Fo of oscillator VFO are at least very substantially reduced.

In effect, the signal C has a value which predicts any phase delay resulting from jitter and compensates for this delay accordingly. As would be expected, as the offset frequency Fos is increased, so the amount of jitter per unit of time increases and the value of the jitter-compensating signal C increases. The average value of the signal B is zero, due to the removal of the d.c. content, and hence the signal C is a function of the amount of jitter caused by the pulse swallowing technique. However, the voltage step out of the phase comparator PC when a pulse is subtracted at the input to divider PD is proportional to the length of the pulse (i.e. one cycle of the VFO output frequency) and is therefore inversely proportional to the frequency Fo. Thus, in the above-mentioned case of a frequency synthesizer having a range of 1.6 MHz to 30 MHz, the amplitude of the signals dealt with by the jitter compensation circuit can vary if the synthesizer is switched from one end of its output frequency range to the other. This can cause inaccuracies in the jitter correction signal C and a gain-controlled amplifier GCA is included in the correction signal circuit, the gain of the amplifier being controlled by a period-to-analogue converter PAC having the frequency Fo fed to its input. In this way, a very precise and accurate compensation for the effects of jitter is provided over the whole frequency range.

While the amplifier is shown preceding the removal circuit DCR, it will be evident to those skilled in the art that it may be located anywhere in the series circuit STR-DCR-INT-PM.

From the above, it can be appreciated that the phase correction signals are derived in a very simple manner directly from the phase jitter actually in the offset frequency source OFS. Further, the correction steps are derived by analogue means—in contradistinction to digital means—with the result that the correction signal does not suffer from the discontinuities which can be introduced by inaccuracies of practical digital-to-analogue converters which occur in known phase prediction methods.

In modern frequency synthesizers, there is a requirement for closely-spaced output frequencies and this results in large division ratios and small values of Fos for a given output frequency. This may result in unacceptable performance in terms of output noise and switching speed. The frequency synthesizer according to the invention, however, allows small frequency increments while at the same time having the noise and switching speed performance of a system with a considerably higher reference frequency Fr.

FIG. 2 shows a frequency synthesizer of the direct type, that is one in which a variable number of pulses from a reference frequency generator is cancelled in order to provide the required (lower) output frequency.

The synthesizer comprises, in sequence, a stable frequency source comprising a clock pulse generator CPG, a programmable divider DIV (if required) whose output comprises pulses having a repetition rate (frequency) Fr, a rate multiplier RM, a delay DL, a ramp generator RG having start and reset inputs S and R, respectively, and an analogue comparator COM the output of which constitutes the output frequency Fo of the synthesizer. The compensation signal circuit comprises a d.c. removal circuit DCR, an analogue integrator INT, a divider DV, and a summing circuit SUM. The multiplying factor of rate multiplier RM is controlled by an input signal n which also determines the division factor of divider DV.

The operation of the circuit is as follows. Rate multiplier RM produces a pulse rate Frm at its output given by Frm=n.Fr where $0<n\leq 1$. As these output pulses are synchronized with the input pulses Fr, they have phase jitter with respect to an evenly-spaced pulse train of the same frequency.

The purpose of the remaining circuitry is to compute the phase errors between the rate multiplier output and said evenly-spaced pulse train and thereby remove the jitter errors. The output signal from the rate multiplier RM first has its DC component removed by circuit DCR and is then integrated by analogue integrator INT. The integrated signal is then divided by the rate multiplier control signal n in the divider DV which may comprise in practice a multiplying digital-to-analogue converter.

The output analogue signal of divider DV is now proportional to the time advances required in the rate multiplier output in order to produce an evenly-spaced pulse train. However, because the ramp generator RG and comparator COM combination is only able to delay the rate multiplier output signals, it is necessary to offset the value of the output of divider DV by an analogue voltage which represents one whole period ("1") of the clock pulses. This is effected by a summing circuit SUM.

Production of evenly-spaced output pulses is as follows. An output pulse from the rate multiplier RM is delayed by delay DL for one clock period to allow time for the analogue integration process to take place. This delayed pulse is then applied to the start input S of the ramp generator RG and causes generator RG to produce a ramp voltage at its output to the non-inverting (+) input of a comparator COM comprising, for example, a differential operational amplifier. The voltage proportional to the required delay is fed to the inverting (−) input of comparator COM from summing circuit SUM. When the ramp voltage reaches this delay voltage, the comparator output goes high and, in turn, resets the ramp generator via its input R. The synthesizer output thus consists of a very short output pulse from comparator COM. Further outputs from the rate multiplier are similarly delayed by the correct amount resulting in an evenly-spaced train of frequency Fo=nFr at the comparator output, where $0<n\leq 1$.

The summing circuit SUM, the ramp generator RG and comparator COM together constitute a programmable delay generator which is controlled by the compensation signal from divider DV such that the output pulses of the delay generator are respectively delayed by such an amount that the periods of occurrence are equal.

A gain-controlled amplifier may, if required, be included in series in the compensation signal circuit in the manner described above with reference to FIG. 1.

While two particular embodiments of the invention have been described, it will be self-evident to those skilled in the art that there are many alternative circuit arrangements for the major part of the synthesizer which excludes the signal compensation circuit. Thus, the pulse train from which the compenstion signal is derived may itself be derived from a variable frequency pulse generator, from the clock pulse generator after suitable division, or from the output frequency of the synthesizer. In these cases, the pulse train is the direct cause of the pulse cancellation—namely each pulse of the train causes a pulse to be cancelled from a higher frequency train. Alternatively, the compensation signal may be derived from a train of pulses in which the pulse cancellation has already been effected, the embodiment shown in FIG. 2 being merely one example of this.

Further, various alternative cycle cancellation circuits to the pulse swallow type of circuit shown in FIG. 1 are known. For example, the pulse swallow circuit PS and the programmable rate divider of FIG. 1 may be replaced by the well known variable modulo divider which, for example, divides by N or by (N+1) according to whether a cancellation command pulse is not, or is, respectively, present at its input.

In the embodiment described with reference to FIG. 1, the compensation signal controls the phase of a phase modulator and in the embodiment described with reference to FIG. 2 the compensation signal controls the delay of a delay generator which, of course, has a similar effect to that of a phase modulator. Alternatively, however, the compensation signal may be added, in an analogue summing device, to the output signal of the phase comparator PC of FIG. 1 in a manner shown, for example, in said U.K. Patent Specification No. 1,447,418.

We claim:

1. A frequency synthesizer comprising a reference frequency generator, a frequency control circuit comprising frequency reduction means which includes a cycle cancellation circuit which is arranged to cancel a cycle of the frequency to be reduced by the reduction means for each input pulse to said cancellation circuit from a pulse source, and a compensation signal circuit connected to the frequency control circuit, the output signal of the compensation signal circuit being arranged to compensate, at least partly, for any jitter in the period of the output frequency of the synthesizer that would otherwise be caused as a result of each cancelled cycle, characterized in that the compenstion signal circuit comprises a d.c. removal circuit followed by an analogue integrator and, in operation, derives the compensation signal directly from a pulse train which itself contains jitter which would otherwise cause said jitter in the period of the output frequency.

2. A frequency synthesizer as claimed in claim 1, wherein an input of the compensation signal circuit is connected to an input of the cycle cancellation circuit.

3. A frequency synthesizer as claimed in claim 1 or 2, wherein the compensation signal circuit further includes an amplifier the gain of which is inversely proportional to the output frequency of the synthesizer.

4. A frequency synthesizer as claimed in claim 1, wherein the pulse source includes a rate multiplier.

5. A frequency synthesizer as claimed in claim 1 or 2, wherein the pulse source comprises a pulse generator having a variable frequency.

6. A frequency synthesizer as claimed in claim 1, wherein the synthesizer is of the phase lock loop type comprising a variable frequency oscillator which provides the synthesizer output frequency, a phase comparator which compares the phases of the output frequency and the reference frequency after said frequency reduction, and a loop filter connected between the output of the phase comparator and a frequency control input of the variable frequency oscillator, wherein a phase modulator is included in an input path to the phase comparator and the output of the compensation signal circuit is connected to the phase modulation control input of the phase modulator.

7. A frequency synthesizer as claimed in claim 1, wherein the synthesizer is of the direct type in which at least the major portion of the output frequency is generated directly from the reference frequency, wherein the compensation signal controls the delay of a delay generator fed with input pulses derived from the reference frequency and having jitter, whereby the output pulses of the delay generator are respectively delayed by such an amount that the periods between them are equal.

8. A frequency synthesizer as claimed in claim 1, wherein an input of the compensation signal circuit is connected to an output of the cycle cancellation circuit.

9. A frequency synthesizer as claimed in claim 3, wherein the pulse source comprises a pulse generator having a variable frequency.

10. A frequency synthesizer comprising a reference frequency generator and a circuit for producing an output signal the frequency of which has a specific but variable ratio to that of an output signal of the reference frequency generator, which circuit has a first input coupled to an output of the reference frequency generator, a second input for a control signal for the phase of the output signal of said circuit, and an output coupled to an output of the synthesizer, said circuit comprising a frequency divider arrangement having a variable division ratio which determines said specific but variable ratio, which frequency divider arrangement includes means for periodically cancelling an effect which a cycle of an input signal to said arrangement would otherwise have on an output signal of said arrangement, the synthesizer also comprising a coupling to said second input from a point in said circuit at which occurs a signal containing information about jitter which would otherwise occur in the period of the output signal of said circuit due to jitter in the period of the output signal of said frequency divider arrangement, for applying a control signal to said second input to thereby compensate for the jitter which would otherwise occur in the period of the output signal of said circuit, characterized in that said point is one at which occurs a pulse train containing jitter which would otherwise give rise to the jitter in the period of the output signal of the circuit and in that said coupling comprises a d.c. removal circuit followed by an analogue integrator.

11. A frequency synthesizer as claimed in claim 10, wherein the signal path through the frequency divider arrangement includes a signal path from a first input to an output of a cycle cancellation circuit which also has a control input coupled to an output of a pulse source and is arranged to effectively cancel a cycle of a signal applied to the first input thereof for each output pulse from said pulse source, said coupling being from the output of the pulse source or the output of the cycle cancellation circuit.

12. A frequency synthesizer as claimed in claim 11, wherein the frequency divider arrangement is included in a phase lock loop and said coupling also includes an amplifier in cascade with the d.c. removal circuit and the analogue integrator, the gain of said amplifier being inversely proportional to the output frequency of the synthesizer.

13. A frequency synthesizer as claimed in claim 11 or 12, wherein the pulse source includes a rate multiplier included in a coupling from an output of a pulse generator to the control input of the cycle cancellation circuit.

14. A frequency synthesizer as claimed in claim 11 or 12, wherein the pulse source includes a pulse generator having a variable output frequency, an output of said pulse generator being coupled to the control input of the cycle cancellation circuit.

15. A frequency synthesizer as claimed in claim 10, 11 or 12, wherein said circuit further comprises a variable frequency oscillator an output of which constitutes the output of said circuit, a phase comparator a first input of which constitutes said first input of said circuit and to a second input of which is coupled the output of said variable frequency oscillator via said frequency divider arrangement, a loop filter connected between an output of the phase comparator and a frequency control input of the variable frequency oscillator, and a phase modulator included in an input signal path to said first input of the phase comparator, a modulation signal input of the phase modulator constituting said second input of said circuit.

16. A frequency synthesizer as claimed in claim 10, 11 or 12, wherein said circuit further comprises a variable frequency oscillator an output of which constitutes the output of said circuit, a phase comparator a first input of which constitutes said first input of said circuit and to a second input of which is coupled the output of said variable frequency oscillator via said frequency divider arrangement, a loop filter connected between an output of the phase comparator and a frequency control input of the variable frequency oscillator, and an analogue summing device the signal path through which from a first input thereof to an output thereof is included in an output path from the phase comparator, a second input of said summing device constituting said second input of said circuit.

17. A frequency synthesizer as claimed in claim 13, wherein said circuit further comprises a variable frequency oscillator an output of which constitutes the output of said circuit, a phase comparator a first input of which constitutes said first input of said circuit and to a second input of which is coupled the output of said variable frequency oscillator via said frequency divider arrangement, a loop filter connected between an output of the phase comparator and a frequency control input of the variable frequency oscillator, and an analogue summing device the signal path through which from a first input thereof to an output thereof is included in an output path from the phase comparator, a second input of said summing device constituting said second input of said circuit.

18. A frequency synthesizer as claimed in claim 14, wherein said circuit further comprises a variable frequency oscillator an output of which constitutes the output of said circuit, a phase comparator a first input of which constitutes said first input of said circuit and to a second input of which is coupled the output of said variable frequency oscillator via said frequency divider arrangement, a loop filter connected between an output of the phase comparator and a frequency control input of the variable frequency oscillator, and an analogue summing device the signal path through which from a first input thereof to an output thereof is included in an output path from the phase comparator, a second input of said summing device constituting said second input of said circuit.

19. A frequency synthesizer as claimed in claim 10, wherein said circuit further comprises a delay generator to an input of which is coupled said first input of said circuit via said frequency divider arrangement and an output of which constitutes the output of said circuit, a delay control input of said delay generator constituting said second input of said circuit.

* * * * *